United States Patent [19]

Hino

[11] Patent Number: 5,757,302

[45] Date of Patent: May 26, 1998

[54] MICROCOMPUTER

[75] Inventor: Yuji Hino, Hyogo, Japan

[73] Assignees: Mitsubishi Electric Semiconductor Software Co., Ltd., Hyogo; Mitsubishi Denki Kabushiki Kaisha, Tokyo, both of Japan

[21] Appl. No.: 757,086

[22] Filed: Nov. 26, 1996

[30] Foreign Application Priority Data

Jun. 12, 1996 [JP] Japan .................. 8-151120

[51] Int. Cl.⁶ .......................... H03M 1/12
[52] U.S. Cl. ............................... 341/155
[58] Field of Search ................ 341/155, 156, 341/166

[56] References Cited

U.S. PATENT DOCUMENTS 5,133,418  7/1992  Gibson et al. ............ 175/45

FOREIGN PATENT DOCUMENTS 60-143025  7/1985  Japan .

OTHER PUBLICATIONS

Mitsubishi Single–Chip Microcomputer User's Manual 3825 Group, Mitsubishi Electric Corporation, Sep. 1994.

Primary Examiner—Brian K. Young
Attorney, Agent, or Firm—Leydig, Voit & Mayer, Ltd.

[57] ABSTRACT

According to the microcomputer of the invention, a free running oscillator can supply the A-D converter with a higher frequency clock signal even while a lower speed clock signal from a second clock signal generating circuit is used as the internal system clock signal. This solves the problem associated with conventional A-D converters that, when executing an A-D conversion, the mode of operation is changed once to a high-speed operation mode in which the conversion can be performed accurately, and after the conversion has been executed, the mode is returned to a low power consumption mode which places an exception load on the software.

4 Claims, 6 Drawing Sheets

F I G. 3
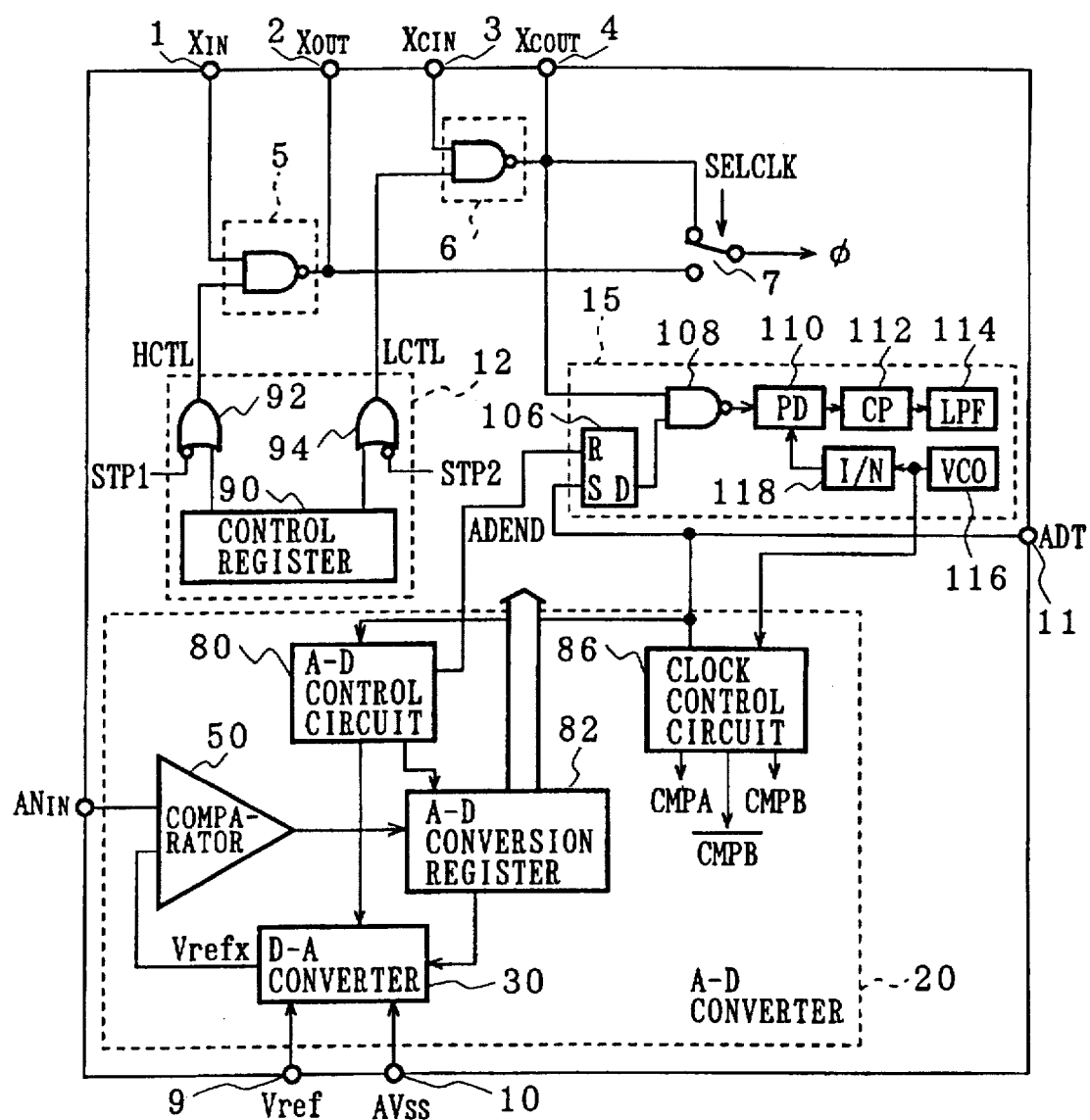

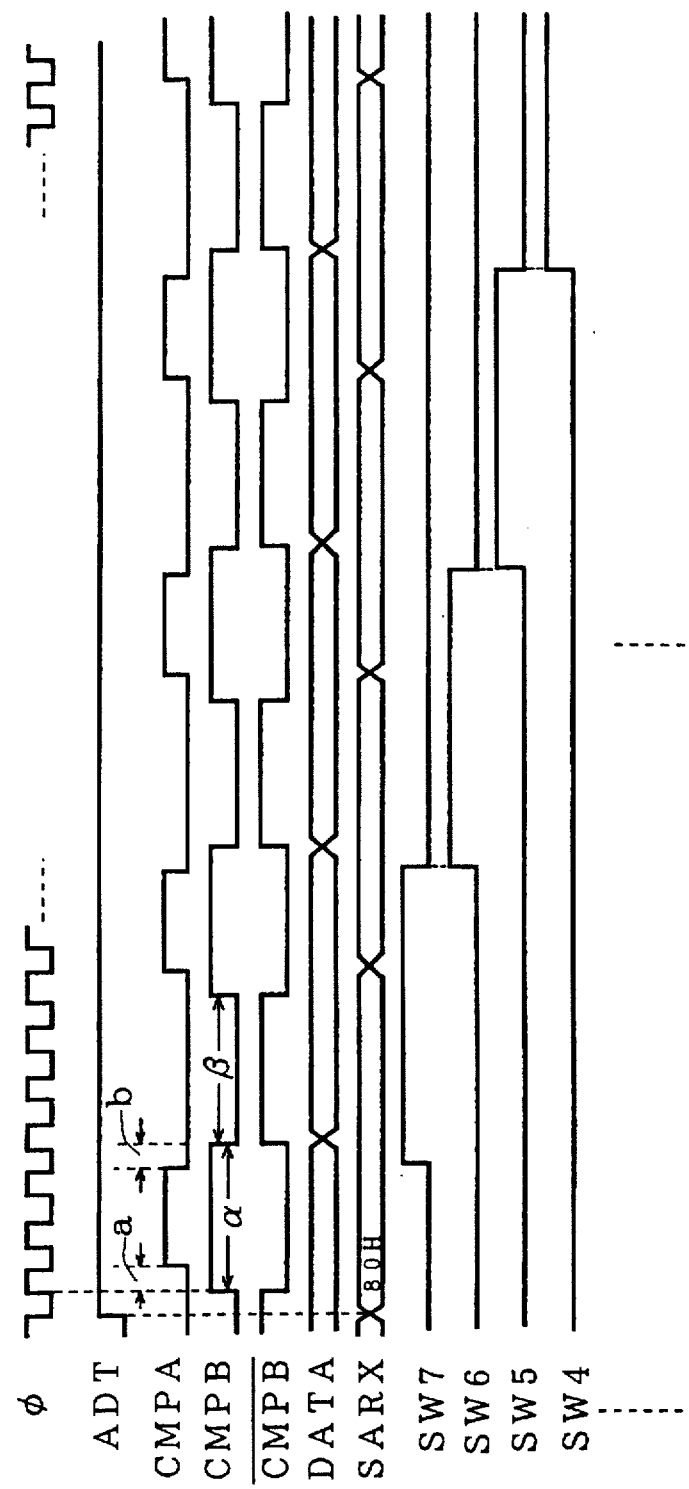

MICROCOMPUTER

BACKGROUND OF THE INVENTION

1. Field of the Invention

The present invention relates to a microcomputer using one clock signal selected from two different clock signals. the microcomputer incorporates an A-D converter for converting an analog signal into a digital signal.

2. Description of the Prior Art

FIG. 4 is a block diagram showing a structure of a prior art microcomputer incorporating an A-D converter described for example in "Mitsubishi Single Chip Microcomputer User's Manual Group 3825" (published by Mitsubishi Electric Corporation in September, 1994). In FIG. 4, there are shown a clock signal generating portion and an A-D converting portion. Referring to the diagram, reference numeral 1 denotes an input terminal of a main clock signal. Reference numeral 2 denotes an output terminal of the main clock signal. Reference numeral 3 denotes an input terminal of a sub-clock signal. Reference numeral 4 denotes an output terminal of the sub-clock signal. Reference numeral 5 denotes a first clock signal generating circuit having an inverted logical product circuit (NAND circuit) for generating a clock signal in cooperation with an oscillator, such as a crystal oscillator, connected between the input terminal 1 and the output terminal 2. Similarly, reference numeral 6 denotes a second clock signal generating circuit having a NAND circuit for generating a clock signal in cooperation with an oscillator connected between the input terminal 3 and the output terminal 4. An oscillator oscillating at a high frequency is connected between the input terminal 1 and the output terminal 2 and an oscillator oscillating at a low frequency is connected between the input terminal 3 and the output terminal 4. Hence, the first clock signal generating circuit 5 generates a high-speed clock signal and the second clock signal generating circuit 6 generates a low-speed clock signal. Reference numeral 7 denotes a switch circuit for selecting either the high-speed clock signal or the low-speed clock signal to thereby output an internal system clock signal φ to each component of the microcomputer. Each clock signal can also be stopped by a stop command from a CPU (not shown) or a setting in a control register and such signals are indicated by the signal HCTL and the signal LCTL in FIG. 4.

Reference numeral 8 denotes an analog signal input terminal to which an analog signal $AN_{IN}$ as the object of the A-D conversion, is input. Reference numeral 9 denotes a reference voltage input terminal to which a reference voltage $V_{ref}$ is input. Reference numeral 10 denotes a potential input terminal to which the ground potential is input. Reference numeral 11 denotes an input terminal to which a signal ADT requesting for the start of an A-D converting operation is input. Reference numeral 20 denotes an A-D converter of a sequential comparison conversion type using a chopper type amplifier. In the A-D converter 20, reference numeral 30 denotes a D-A converter for executing a D-A conversion upon receipt of a reference voltage $V_{ref}$ and a digital signal to thereby output a reference voltage $V_{refx}$. Reference numeral 50 denotes a comparator for comparing the voltage of the analog signal $AN_{IN}$ input to the analog signal input terminal 8 with the reference voltage $V_{refx}$. Reference numeral 80 denotes an A-D control circuit for controlling A-D converting operations. Reference numeral 82 denotes an A-D conversion register for storing the result of the A-D conversion and reference numeral 86 denotes a clock control circuit for generating a clock signal used for the A-D conversion.

FIG. 5 is a circuit diagram showing structures of the D-A converter 30, the comparator 50, and the A-D conversion register 82 in the A-D converter 20. In this figure, an input analog signal is converted into an 8-bit digital signal. In the D-A converter 30, reference numeral 32 denotes a ladder resistor circuit for generating voltages between the reference voltage $V_{ref}$ and the voltage input to the potential input terminal 10 and reference numeral 34 denotes a group of switches for selecting the values corresponding to the digital values SAR0–SAR7 in the A-D conversion register 82 from the voltage values in the ladder resistor circuit 32. In the comparator 50, reference numeral 52 denotes a switch circuit for switching the analog signal $AN_{IN}$. Reference numeral 54 denotes a switch circuit for switching the reference voltage $V_{refx}$. 56 denotes a capacitor. Reference numeral 58 denotes an inverting amplifier receiving the potential of the capacitor 56. Reference numeral 60 denotes a switch circuit connected between the input and the output of the inverting amplifier 58. Reference numeral 62 denotes a switch circuit connected to the output side of the inverted amplifier 58. 64 and 66 denote inverter circuits provided at the rear stage of the switch circuit 62. Reference numeral 68 denotes a switch circuit connected between the input side of the inverter circuit 64 and the output side of the inverter circuit 66 and reference numeral 70 denotes an inverter circuit provided at the rear stage of the switch circuit 68. The output of the inverter circuit 70 is set up in the A-D conversion register 82 by means of switches SW0–SW7 provided, correspondingly, to each of the bits.

With reference to a timing chart of FIG. 6, operations will be described below.

As the signal ADT indicating the start of the A-D converting operation goes high, the clock control circuit 86 generates a signal CMPA and a signal CMPB from the internal system clock signal φ. The signal ADT is supplied from the outside through the input terminal 11 of the microcomputer or from the CPU. When the signal ADT goes high, the A-D control circuit 80 sets up "10000000(B)"= "80(H)" in the A-D conversion register 82. The bit at which "1" is set up is the seventh bit (MSB) in the A-D conversion register 82. The contents of the A-D conversion register 82 are supplied to the group of switches 34 of the D-A converter 30. The group of switches 34 are configured to output, for example, [(reference voltage $V_{ref}/256$)×(value of A-D conversion register)] as the reference voltage $V_{refx}$. Although a slightly smaller value than [(reference voltage $V_{ref}/256$)× (value of A-D conversion register)] is output in reality, the value [(reference voltage $V_{ref}/256$)×(value of A-D conversion register)] is defined herein as the reference voltage $V_{refx}$ to make the explanation simple.

Since the signal CMPB goes high first in the period α indicated in FIG. 6, the switch circuit 52 is closed. Accordingly, the voltage $V_{ANIN}$ of the analog signal $AN_{IN}$ is applied to the capacitor 56. Since the signal CMPA goes high when the period α has passed, the switch circuit 60 closes. Then, the input level and the output level of the inverting amplifier 58 become $½V_{DD}$. The voltage $V_{DD}$ is the power supply voltage. Therefore, the potential difference between the input and the output of the capacitor 56 becomes ($½V_{DD}-V_{ANIN}$). When the signal CMPA goes low, the switch circuit 60 opens. However, since there is no movement of electric charges, the output level of the inverting amplifier 58 is maintained at $½V_{DD}$.

As the period β begins and the signal CMPB goes low, the switch circuit 52 opens and the switch circuit 54 closes. At the same time, the switch circuit 62 closes. Since the switch circuit 54 is closed, the reference voltage $V_{refx}$ is applied to the capacitor 56. The capacitor 56 is charged or discharged according to the relative magnitude of the potential difference ($\frac{1}{2}V_{DD}-V_{ANIN}$) and the reference voltage $V_{refx}$. Since the potential of the capacitor 56 changes accordingly, the output level of the inverting amplifier 58 changes from $\frac{1}{2}V_{DD}$ which is transmitted to the inverter circuit 70 through the inverter circuits 64 and 66.

The comparator 50 is set so that the output DATA of the inverter circuit 70 becomes "0" when reference voltage $V_{refx}$>voltage $V_{ANIN}$, and, otherwise, the output DATA of the inverter circuit 70 becomes "1". Furthermore, the A-D control circuit 80 closes any of the switches SW0–SW7 when the signal CMPA falls. In this case, it closes the switch SW7. Hence, in the case where the reference voltage $V_{refx}$>voltage $V_{ANIN}$, the seventh bit of the A-D conversion register 82 becomes "0". In the next place, the A-D control circuit 80 sets the sixth bit of the A-D conversion register 82 to "1". Then, the D-A converter 30 and the comparator 50 perform the similar operation to those described above and sets the sixth bit of the A-D conversion register 82 to "0" or "1". Similar operations to those described above are performed for the fifth bit to the zeroth bit of the A-D conversion register 82 and when the operations as described above for the zeroth bit of the A-D conversion register 82 have been completed, the A-D control circuit 80 outputs a signal ADEND indicating the end of the A-D converting operations. At this time, the final value of the A-D conversion is set up in the A-D conversion register 82. The CPU acknowledges the outputting of the signal ADEND and reads the contents of the A-D conversion register 82.

Since the signal CMPA and the signal CMPB are generated by the use of the internal system clock signal φ, the periods of the signal CMPA and the signal CMPB become longer when the frequency of the internal system clock signal φ is lower. When the signal CMPA goes low, the switch circuit 60 opens. During the period b indicated in FIG. 6, the potential of the capacitor 56 must be maintained at ($\frac{1}{2}V_{DD}-V_{ANIN}$). However, if the period b is prolonged, the change in the potential of the capacitor 56 due to leakage of electric charges becomes nonnegligible. Therefore, while A-D converting operation is being performed, the frequency of the internal system clock signal φ should be kept at a certain high level to prevent deterioration in the converting accuracy. Incidentally, the use of clock signal higher than 500 kHz is recommended in the Mitsubishi group 3825 single chip microcomputer.

While the frequency of the clock signal output from the first clock signal generating circuit 5 is, for example, tens of MHz, the frequency of the clock signal output from the second clock signal generating circuit 6 is generally set at tens of kHz. For example, it is set at 32 kHz. During the period in which no high-speed operation is required, the microcomputer is by the clock signal output from the second clock operated signal generating circuit 6 for power saving and other reasons. Hereinafter, the case where the microcomputer is operated by the clock signal from the first clock signal generating circuit 5 will be called "high-speed operation mode" and the case where it is operated by the clock signal from the second clock signal generating circuit 6 will be called "low power consumption mode". If an A-D converting operation is attempted while the microcomputer is operated in the low power consumption mode (i.e., while the clock signal from the second clock signal generating circuit 6 is selected by the switch circuit 7) the CPU must first canceling the stopped condition of the first clock signal generating circuit 5 and then must set the switch circuit 7 to select the clock signal from the first clock signal generating circuit 5. Further, when the A-D converting operation has been completed, the CPU must return the first clock signal generating circuit 5 to its stopped state and return the setting of the switch circuit 7 to the original state to restore the low power consumption mode.

Since the prior art microcomputer was configured as described above, it could not execute the A-D converting operation in the low power consumption mode, i.e., it had to change the mode, once, to the high-speed operation mode for executing the A-D converting operation, and then it had to restore the low power consumption mode. Accordingly, there has been a problem that an excessive load has been placed on the CPU or on the software.

SUMMARY OF THE INVENTION

The present invention has been made to solve the above mentioned problem. Accordingly, it is an object of the present invention to provide a microcomputer of a type using one clock signal selected from two clock signals, the microcomputer being capable of easily performing A-D conversion even while operating at the lower-speed clock signal.

According to a first configuration of the invention, in a microcomputer including an A-D converter using a chopper type amplifier for executing comparison, a clock signal supply means is adapted to supply the A-D converter with a clock signal at which the A-D converter can perform its converting operation with the accuracy as desired.

According to a second configuration of the invention, the clock signal supply means is configured to include a free running oscillator.

According to a third configuration of the invention, the clock signal supply means is configured to include a high-speed clock control circuit for starting the clock signal generating circuit generating the higher-speed clock signal of the two so that the clock signal from the clock signal generating circuit generating the higher-speed clock signal is supplied to the A-D converter.

According to a fourth configuration of the invention, the clock signal supply means is configured to include a frequency multiplying circuit for multiplying the frequency of the lower-speed clock signal and supplying the thus obtained signal to the A-D converter.

BRIEF DESCRIPTION OF THE DRAWINGS

FIG. 3 is a block diagram showing a structure of a microcomputer according to a third embodiment of the invention.

FIG. 6 is a timing chart explanatory of operations of the A-D converter.

DETAILED DESCRIPTION OF THE PREFERRED EMBODIMENTS

First Embodiment

Figure 1:
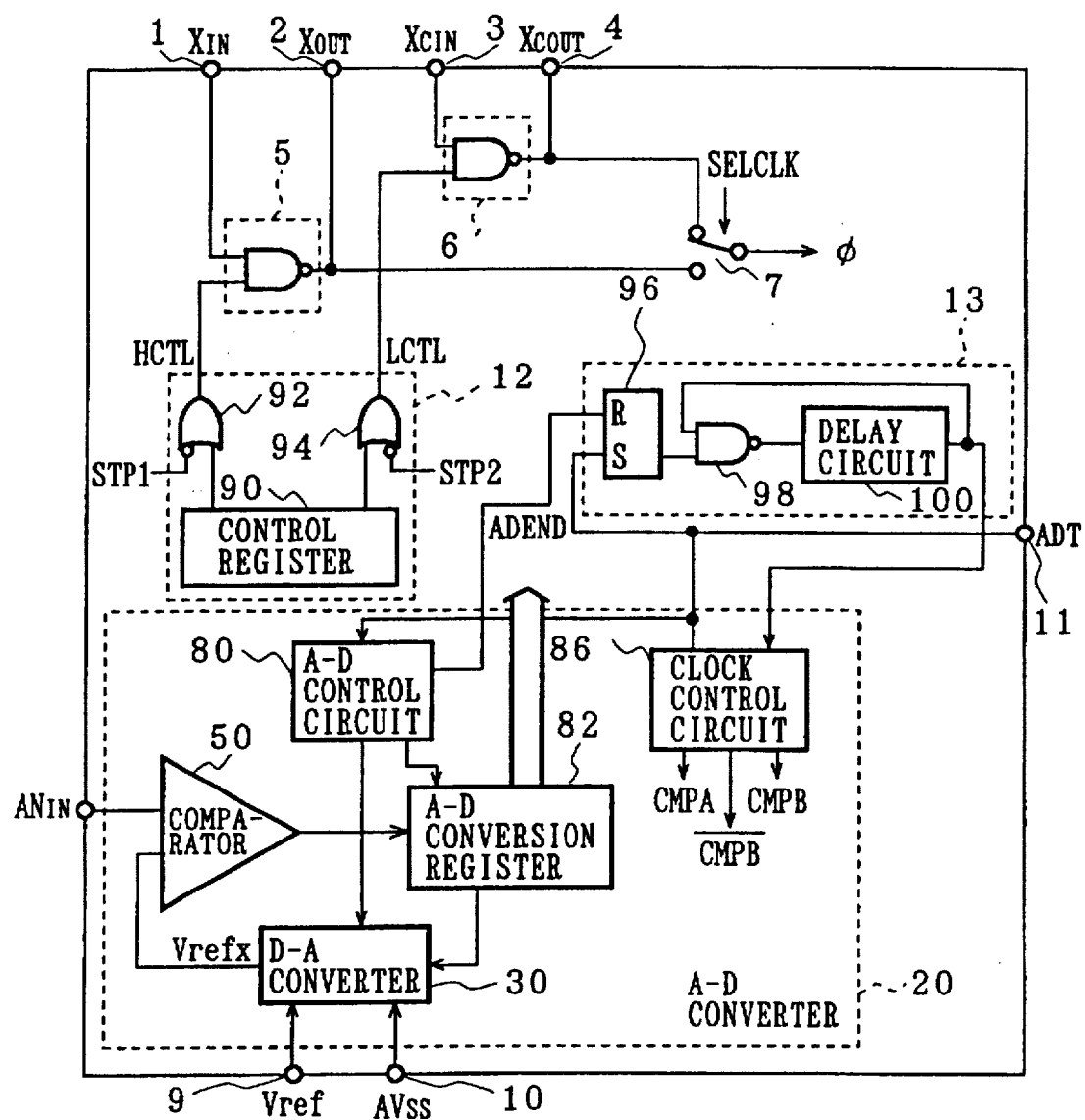
FIG. 1 is a block diagram showing a structure of a microcomputer according to a first embodiment of the invention.

FIG. 1 is a block diagram showing a structure of a microcomputer according to a first embodiment of the invention. In FIG. 1, there are shown a clock signal generating portion and an A-D converting portion. Referring to the diagram, reference numeral 12 denotes a clock generation control circuit for controlling operations of a first clock signal generating circuit 5 and a second clock signal generating circuit 6 and reference numeral 13 denotes a free-running oscillator (clock signal supply means) by means of a ring oscillator. In the clock generation control circuit 12, reference numeral 92 denotes a logical circuit for outputting a signal HCTL at a high level when a bit set up in a control register 90 within the microcomputer is "1" or when a stop command STP1 from the CPU (not shown) is nonsignificant. Reference numeral 94 denotes a logical circuit for outputting a signal LCTL at high level when a bit set up in the control register 90 within the microcomputer is "1" or when a stop command STP2 from the CPU is nonsignificant.

Figure 4:
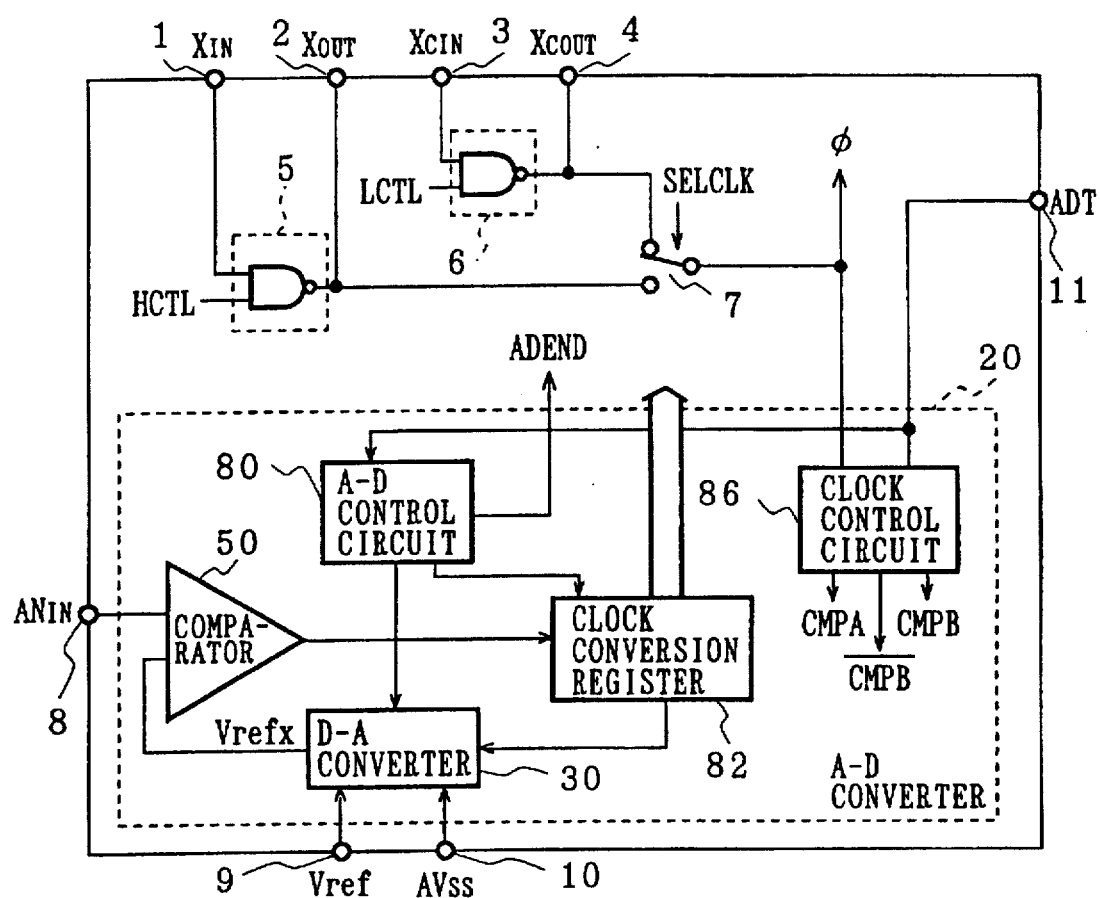
FIG. 4 is a block diagram showing a structure of a prior art microcomputer.
Figure 5:
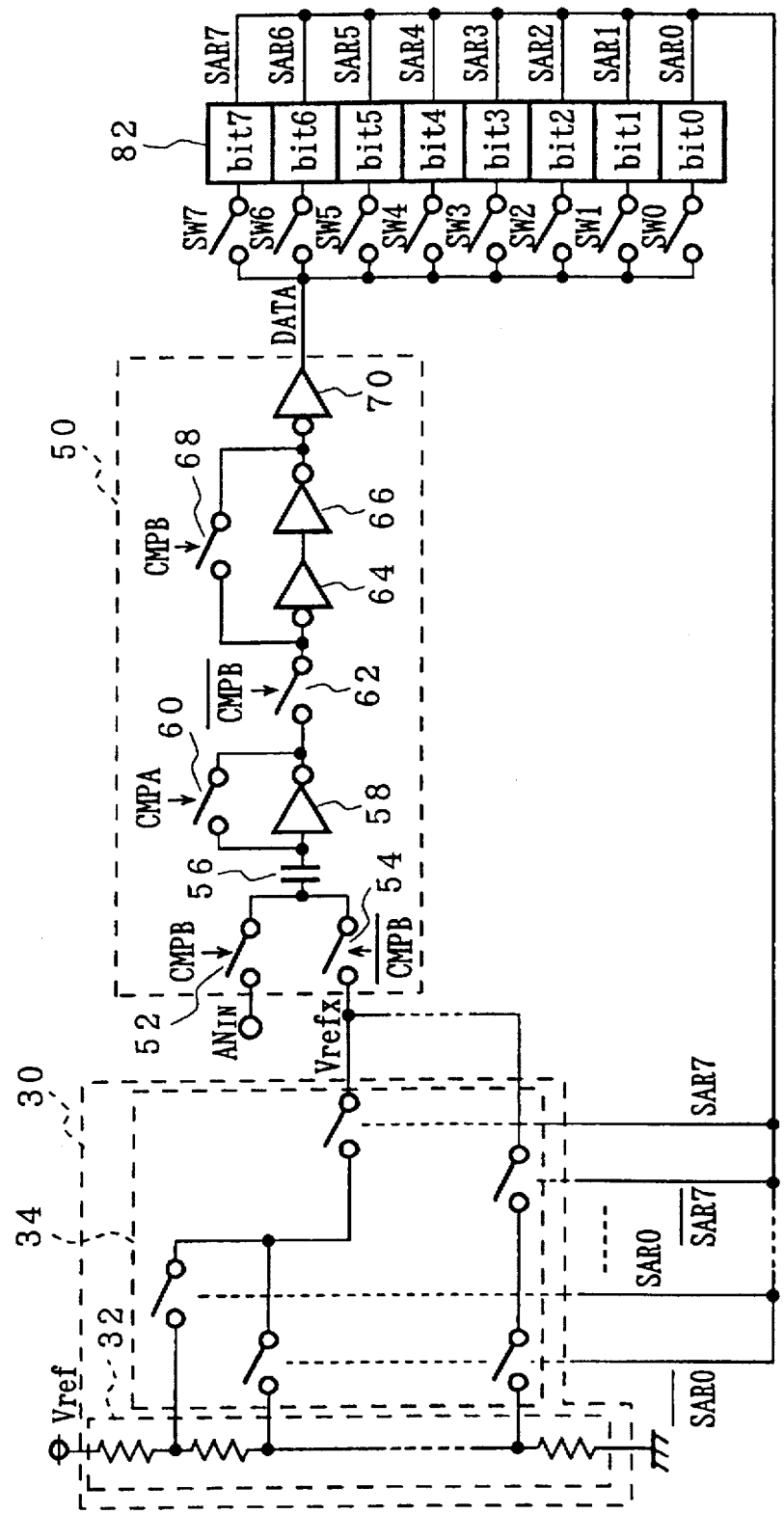
FIG. 5 is a circuit diagram showing structures of a D-A converter, a comparator, and an A-D conversion register.

In the free-running oscillator 13, reference numeral 96 denotes a flip-flop set by the rise of a signal ADT requesting for the start of an A-D converting operation and reset by a signal ADEND indicating the end of the A-D converting operation. Reference numeral 98 denotes a NAND circuit gated by the output of the flip-flop 96 and reference numeral 100 denotes a delay circuit for delaying the output of the NAND circuit 98 and feeding back the delayed signal to the NAND circuit 98. The other components are the same as those shown in FIG. 4.

Assuming the microcomputer is operating in the low power consumption mode, the switch circuit 7 is set to select the clock signal from the second clock signal generating circuit 6 by a select command (SELCLK) from the CPU or by the setting of a relevant bit in the control register 90 to "1". Further, the signal HCTL is held at a low level by the stop command STP1 from the CPU or the setting of a relevant bit within the control register 90 to "1". Hence, the first clock signal generating circuit 5 is stopped.

As the signal ADT requesting for the start of an A-D converting operation goes high, the flip-flop 96 in the free-running oscillator 13 is set and, hence, the NAND circuit 98 is brought into its state allowing a signal to pass therethrough. Therefore, the ring oscillator, made up of the NAND circuit 98 and the delay circuit 100, starts oscillating. Here, the oscillation frequency of the ring oscillator is set at such a high frequency that the leakage of electric charges from the capacitor in the comparator 50 of the A-D converter 20 can be neglected.

Since the signal ADT is to high level, the A-D converter 20 executes the A-D converting operation in the same way as in the conventional case. In this case, the clock control circuit 86 in the A-D converter 20 does not use the internal system clock signal φ, but uses the clock signal from the free-running oscillator 13. When the A-D converting operation has been completed, the A-D control circuit 80 outputs the signal ADEND indicating the end of the A-D converting operation. The flip-flop 96 within the free-running oscillator 13 is reset by the signal ADEND. Hence, the NAND circuit 98 is closed and the ring oscillator stops its oscillation.

As described above, according to the first embodiment, when the signal ADT requesting for the start of an A-D converting operation goes high, supply of the clock signal with a high frequency from the free-running oscillator 13 to the A-D converter 20 is started and, when the ADEND signal indicating the end of the A-D converting operation is output, the supply of the clock signal from the free-running oscillator 13 to the A-D converter 20 is automatically stopped. Although the microcomputer operates in the low power consumption mode in the meantime, the software is not required to perform the process of changing the mode to the high-speed operation mode.

Second Embodiment

Figure 2:
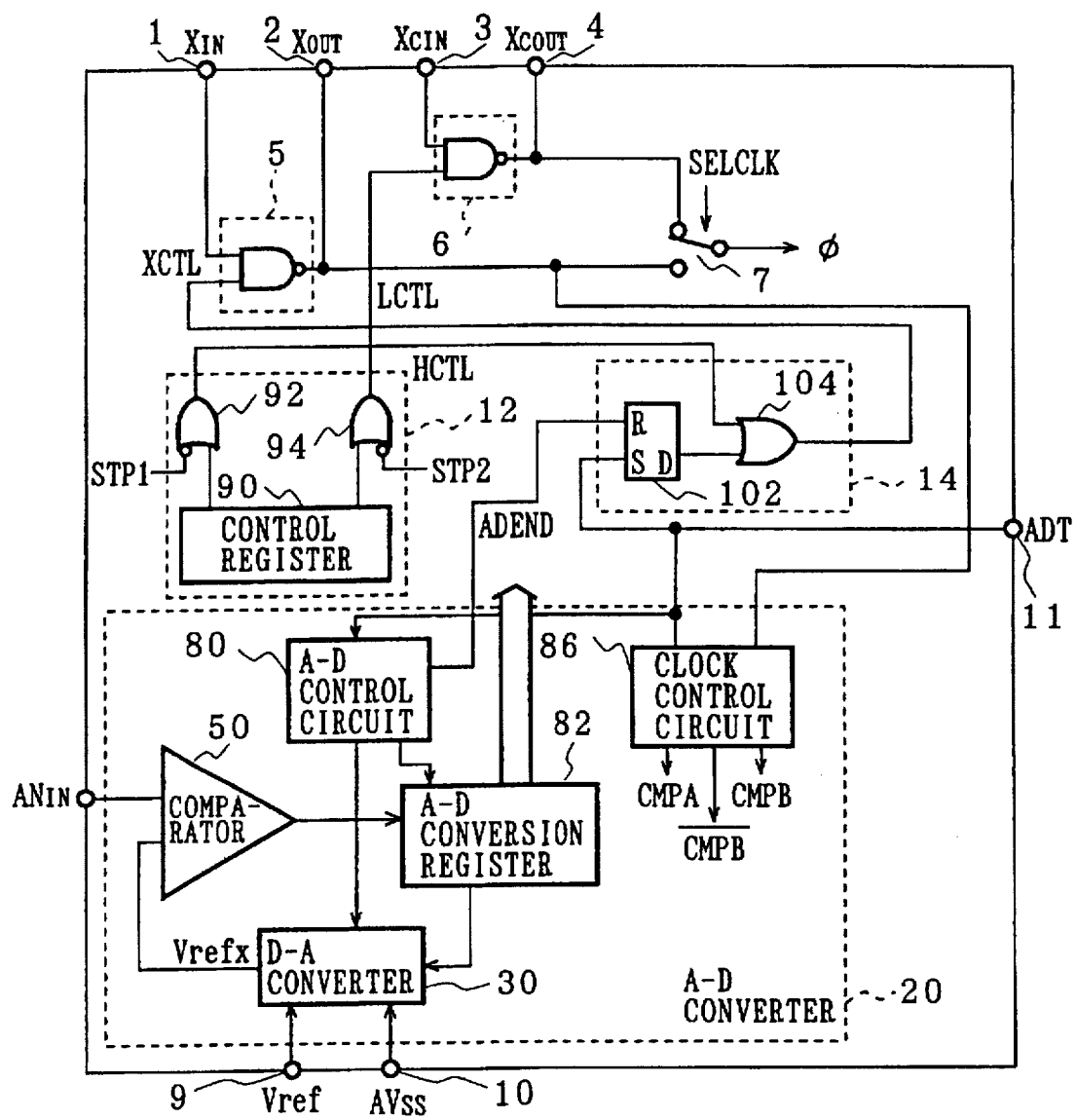
FIG. 2 is a block diagram showing a structure of a microcomputer according to a second embodiment of the invention.

FIG. 2 is a block diagram showing a structure of a microcomputer according to a second embodiment of the invention. In FIG. 2, there are shown a clock signal generating portion and an A-D converting portion. Referring to the diagram, reference numeral 14 denotes a high-speed clock control circuit (clock signal supply means) for generating a signal XCTL. In this case, the signal XCTL is supplied to the first clock signal generating circuit 5. In the high-speed clock control circuit 14, reference numeral 102 denotes a flip-flop set by the rise of the signal ADT requesting the start of an A-D converting operation and reset by the signal ADEND indicating the end of the A-D converting operation. Reference numeral 104 denotes a logical sum circuit (OR circuit) taking the logical sum of the output of the flip-flop 102 and the signal HCTL. In the initial state, the flip-flop 102 is reset. All other components are the same as those shown in FIG. 1.

Assuming the microcomputer is now operating in the low power consumption mode. Hence, the switch circuit 7 is set to select the clock signal from the second clock signal generating circuit 6 by the select command (SELCLK) from the CPU (not shown) or by the setting of a relevant bit in the control register 90 to "1". Further, the signal HCTL is held at a low level by the stop command STP1 from the CPU or the setting of a relevant bit within the control register 90 to "1". Since the flip-flop 102 is in the reset state and the signal HCTL is at a low level in the high-speed clock control circuit 14, the signal XCTL is at low level. Accordingly, the first clock signal generating circuit 5 is stopped.

As the signal ADT requesting for the start of an A-D converting operation goes high, the flip-flop 102 is set and, hence, the signal XCTL goes high. Accordingly, the first clock signal generating circuit 5 starts operating. Since the signal ADT is at a high level, the A-D converter 20 performs the A-D converting operation. In this case, the clock control circuit 86 in the A-D converter 20 does not use the internal system clock signal φ, but uses the clock signal from the first clock signal generating circuit 5 led in from the front of the switch circuit 7. When the A-D converting operation has been completed, the A-D control circuit 80 outputs the signal ADEND indicating the end of the A-D converting operation.

The flip-flop 102 within the high-speed clock control circuit 14 is reset by the signal ADEND. Hence, the signal XCTL goes low. Accordingly, the first clock signal generating circuit 5 stops its operation.

As described above, according to the second embodiment, when the signal ADT requesting the start of an A-D converting operation goes high, the first clock signal generating circuit 5 starts its operation and, at the same time, supply of the clock signal with the higher frequency from the first clock signal generating circuit 5 to the A-D converter 20 is started and, when the signal ADEND indicating the end of the A-D converting operation is output, the supply of the clock signal to the A-D converter 20 is automatically stopped. Although the microcomputer operates in the low power consumption mode in the meantime, the software is not required to perform the process for changing the mode to the high-speed operation mode.

Third Embodiment

FIG. 3 is a block diagram showing a structure of a microcomputer according to a third embodiment. In FIG. 3, there are shown a clock signal generating portion and an A-D converting portion. Referring to the diagram, reference numeral 15 denotes a frequency multiplying circuit (clock signal supply means) for multiplying the frequency of the clock signal from the second clock signal generating circuit 6 by N (N: natural number) by means of a phase locked loop (PLL).

In the frequency multiplying circuit 15, reference numeral 106 denotes a flip-flop set by the rise of the signal ADT requesting for the start of an A-D converting operation and reset by the signal ADEND indicating the end of the A-D converting operation. Reference numeral 108 denotes a NAND circuit using the output of the flip-flop 106 as the gate signal for allowing the clock signal from the second clock signal generating circuit 6 to pass therethrough. Reference numeral 110 denotes a phase comparator for executing phase comparison between the output of the NAND circuit 108 and the output of a frequency divider 118. Reference numeral 112 denotes a charge pump for outputting a voltage indicating signal corresponding to the phase difference signal output from the phase comparator 110. Reference numeral 114 denotes a low-pass filter for smoothing the voltage indicating signal from the charge pump 112 to thereby generate a control voltage. Reference numeral 116 denotes a voltage-controlled oscillator for generating a clock signal with the frequency corresponding to the control voltage and reference numeral 118 denotes a frequency divider for changing the frequency of the clock signal from the voltage-controlled oscillator 116 to its 1/N. The clocossignal from the voltage-controlled oscillator 116 is supplied to the A-D converter 20. Further, the frequency of the clock signal is set at such a high frequency that the leakage of electric charges from the capacitor in the comparator 50 of the A-D converter 20 can be neglected. The other components are the same as those shown in FIG. 1.

Assuming the microcomputer is now operating in the low power consumption mode. Hence, the switch circuit 7 is set to select the clock signal from the second clock signal generating circuit 6 by the select command (SELCLK) from the CPU (not shown) or by the setting of a relevant bit in the control register 90 at "1". Further, the signal HCTL is held a low level by the stop command STP1 from the CPU or the setting of a relevant bit within the control register 90 at "1". Accordingly, the first clock signal generating circuit 5 is stopped.

As the signal ADT requesting for the start of an A-D converting operation goes high, the flip-flop 106 in the frequency multiplying circuit 15 is set and, hence, the NAND circuit 108 allows the clock signal from the second clock signal generating circuit 6 to pass therethrough. Therefore, the PLL made up of the phase comparator 110, charge pump 112, low-pass filter 114, voltage-controlled oscillator 116, and the frequency divider 118 generates a clock signal with the frequency being N times as high as the frequency of the clock signal from the second clock signal generating circuit 6.

Since the signal ADT is at a high level, the A-D converter 20 executes the A-D converting operation. In this case, the clock control circuit 86 in the A-D converter 20 does not use the internal system clock signal φ, but uses the clock signal from the frequency multiplying circuit 15. When the A-D converting operation has been completed, the A-D control circuit 80 outputs the signal ADEND indicating the end of the A-D converting operation. The flip-flop 106 is reset by the signal ADEND. Hence, the NAND circuit 108 is closed and the PLL stops its oscillation, and, thus, the supply of the clock signal to the A-D converter 20 is stopped.

As described above, according to the third embodiment, when the signal ADT requesting for the start of an A-D converting operation goes high, supply of a clock signal with a high frequency from the frequency multiplying circuit 15 to the A-D converter 20 is started and, when the ADEND signal indicating the end of the A-D converting operation is output, the supply of the clock signal to the A-D converter 20 is automatically stopped. Although the microcomputer operates in the low power consumption mode in the meantime, the software is not required to perform the process to change the mode to the high-speed operation mode. Further, it is not necessary to drive the clock signal generating circuit for generating the higher-speed clock signal.

Although the case where the frequency multiplying circuit 15 by means of a PLL is used was described above, a frequency multiplying circuit 15 of any other configuration may be used provided it can multiply the frequency of the clock signal from the second clock signal generating circuit 6 to thereby provide such a high frequency at which the leakage of electric charges from the capacitor in the comparator 50 can be neglected.

According to the first configuration of the invention, as described above, the microcomputer is configured such that clock signal supply means supplies a predetermined clock signal to the A-D converter. Therefore, such an effect is obtained that converting accuracy of the A-D converter can be maintained even while the lower-speed clock signal of the first clock signal and the second clock signal is used as the internal system clock signal without increasing the load on software.

According to the second configuration of the invention, since the microcomputer is configured to generate the clock signal supplied to the A-D converter by means of a free running oscillator, an effect is obtained that the A-D converter can maintain accuracy in conversion without software intervention even while the lower-speed clock signal is used as the internal system clock signal. Furthers such an effect is obtained that the frequency used by the A-D converter can be set regardless of the frequencies of the first clock signal and the second clock signal.

According to the third configuration of the invention, since the microcomputer is configured to include a high-speed clock control circuit for starting the clock signal generating circuit, which generates the higher-speed clock signal, at the time when an A-D converting operation is performed, such an effect is obtained that the A-D converter can maintain accuracy in conversion without software intervention even while the lower-speed clock signal is used as the internal system clock signal. Further, such an effect is obtained that the clock signal used by the A-D converter can be generated with the use of an existing clock signal.

According to the fourth configuration of the invention, since the microcomputer is configured to generate the clock signal supplied to the A-D converter by means of a frequency multiplying circuit for multiplying the frequency of the lower-speed clock signal, such an effect is obtained that the A-D converter can maintain accuracy in conversion without software intervention even while the lower-speed clock signal is used as the internal system clock signal. Further, such an effect can be obtained that the clock signal generating circuit generating the higher-speed clock signal need not be driven at all.

What is claimed is:

1. A microcomputer comprising:

a first clock signal generating circuit for generating a first clock signal having a first clock rate;

a second clock signal generating circuit for generating a second clock signal having a second clock rate, the second clock rate being slower than the first clock rate, and outputting the second clock signal as a system clock during low power operation;

an analog-to-digital converter including a chopper amplifier for performing a comparison operation; and clock signal supply means for supplying a third clock signal to said analog-to-digital converter having a third clock rate faster than the second clock rate, in response to a first control signal requesting starting of an analog-to-digital converting operation and stopping supply of the third clock signal in response to a second control signal indicating ending of the analog-to-digital converting operation.

2. The microcomputer according to claim 1, wherein said clock signal supply means includes a free running oscillator for generating the third clock signal.

3. The microcomputer according to claim 1, wherein said clock signal supply means includes a high-speed clock control circuit for controlling said first clock signal generating circuit to produce the third clock signal in response to the second control signal.

4. The microcomputer according to claim 1, wherein said clock signal supply means includes a frequency multiplying circuit for producing the third clock signal by multiplying the frequency of the second clock signal.

* * * * *